United States Patent [19]

Nakamura et al.

[11] Patent Number: 5,314,577
[45] Date of Patent: May 24, 1994

[54] AT-CUT CRYSTAL OSCILLATING REED AND METHOD OF ETCHING THE SAME

[75] Inventors: Hideaki Nakamura; Eiji Karaki, both of Suwa, Japan

[73] Assignee: Seiko Epson Corporation, Tokyo, Japan

[21] Appl. No.: 901,293

[22] Filed: Jun. 19, 1992

Related U.S. Application Data

[62] Division of Ser. No. 691,888, Apr. 26, 1990, abandoned.

[30] Foreign Application Priority Data

| Apr. 27, 1990 | [JP] | Japan | 2-114686 |
| Sep. 19, 1990 | [JP] | Japan | 2-249649 |
| Sep. 19, 1990 | [JP] | Japan | 2-249650 |
| Sep. 19, 1990 | [JP] | Japan | 2-249651 |
| Sep. 19, 1990 | [JP] | Japan | 2-249652 |
| Sep. 21, 1990 | [JP] | Japan | 2-252260 |
| Sep. 21, 1990 | [JP] | Japan | 2-252261 |

[51] Int. Cl.⁵ .................. B44C 1/22; H01L 41/04
[52] U.S. Cl. .................. 156/659.1; 156/657; 156/660
[58] Field of Search ............ 156/657, 659.1, 660

[56] References Cited

U.S. PATENT DOCUMENTS

| 2,443,700 | 6/1948 | Sylvester et al. | 310/365 |
| 2,677,064 | 1/1950 | Hill | 310/8.2 |
| 2,799,789 | 7/1957 | Wolfskill | 310/361 |
| 3,434,896 | 3/1969 | Chance | 156/657 |
| 3,634,161 | 1/1972 | Schimmer et al. | 156/657 |
| 3,760,471 | 9/1973 | Börner | 29/25.35 |
| 3,940,638 | 2/1976 | Terayama | 310/364 |
| 4,124,809 | 11/1978 | Engldahl et al. | 310/361 |
| 4,188,557 | 2/1980 | Mattuschka | 310/368 |
| 4,234,812 | 11/1980 | Kawashima | 310/361 |
| 4,245,173 | 1/1981 | Zumsteg et al. | 310/361 |
| 4,247,797 | 1/1981 | Echigo et al. | 310/361 |
| 4,306,170 | 12/1981 | Motte et al. | 310/361 |
| 4,326,142 | 4/1982 | Mattuschka | 310/364 |
| 4,355,257 | 10/1982 | Kawashima et al. | 310/361 |
| 4,357,554 | 11/1982 | Peters | 310/367 |
| 4,379,247 | 4/1983 | Mattuschka | 310/367 |
| 4,468,582 | 8/1984 | Fujiwara et al. | 310/364 |

(List continued on next page.)

FOREIGN PATENT DOCUMENTS

| 0067285 | 6/1977 | Japan. |
| 0107293 | 9/1979 | Japan. |
| 55-37052 | 3/1980 | Japan. |
| 56-34216 | 4/1981 | Japan. |
| 57-32115 | 2/1982 | Japan. |
| 0015318 | 1/1984 | Japan. |
| 59-182615 | 10/1984 | Japan. |

(List continued on next page.)

OTHER PUBLICATIONS

Experimental Results on Aging of At-Cut Strip Resonators, by J. R. Gehrke et al., 42nd Annual Frequency Control Symposium-1988, pp. 412-419.

*Primary Examiner*—Carl F. Dees
*Attorney, Agent, or Firm*—Blum Kaplan

[57] ABSTRACT

An AT-cut crystal oscillating reed formed by etching an AT-cut crystal wafer is provided. The wafer has a rotational parallel cut obtained by rotating a parallel cut by an angular degree of $\theta°$ relative to the X-axis of the wafer. The etching cross-section of the AT-cut crystal oscillating reed has a surface at an angle about 90° from the front or back surface of the AT-cut crystal oscillating reed. This AT-cut crystal oscillating reed exhibits uniform characteristics and excellent reliability. Also provided is an AT-cut crystal oscillating reed with a low CI value. Finally, a method of etching an AT-cut crystal oscillating reed from an AT-cut crystal wafer is provided. A corrosion resisting film with gaps coats the wafer and is used in the etching process. In a preferred embodiment, the thickness of the wafer is designated t, the width of the gaps in the corrosion resisting films is designated l, and $1 \leq t/\tan \theta$. The corrosion resisting film may be metal and may be formed into electrodes after the crystal oscillating reed is etched. In this manner, crystal oscillating reeds may be mass produced at a relatively low cost.

10 Claims, 17 Drawing Sheets

U.S. PATENT DOCUMENTS

| | | | |
|---|---|---|---|
| 4,476,411 | 10/1984 | Okazaki et al. | 310/361 |
| 4,499,395 | 2/1985 | Kahan | 310/361 |
| 4,618,798 | 10/1986 | Zingg | 310/366 |
| 4,631,437 | 12/1986 | Ballato | 310/369 |
| 4,642,511 | 2/1987 | Chason et al. | 310/368 |
| 4,716,332 | 12/1987 | Hayashi | 310/368 |
| 4,900,971 | 2/1990 | Kawashima | 310/367 |
| 4,919,993 | 4/1990 | Woodruff | 156/657 |

FOREIGN PATENT DOCUMENTS

| | | | |
|---|---|---|---|
| 0285013 | 11/1988 | Japan . | |
| 1-179513 | 7/1989 | Japan . | |
| 0044979 | 2/1991 | Japan . | |
| 633136 | 11/1978 | U.S.S.R. . | |
| 809424 | 2/1959 | United Kingdom . | |
| 1014662 | 12/1965 | United Kingdom . | |
| 2021311 | 11/1979 | United Kingdom . | |
| 2032172 | 4/1980 | United Kingdom . | |
| 2059679 | 4/1981 | United Kingdom | 156/657 |

FIG. 24
FIG. 25
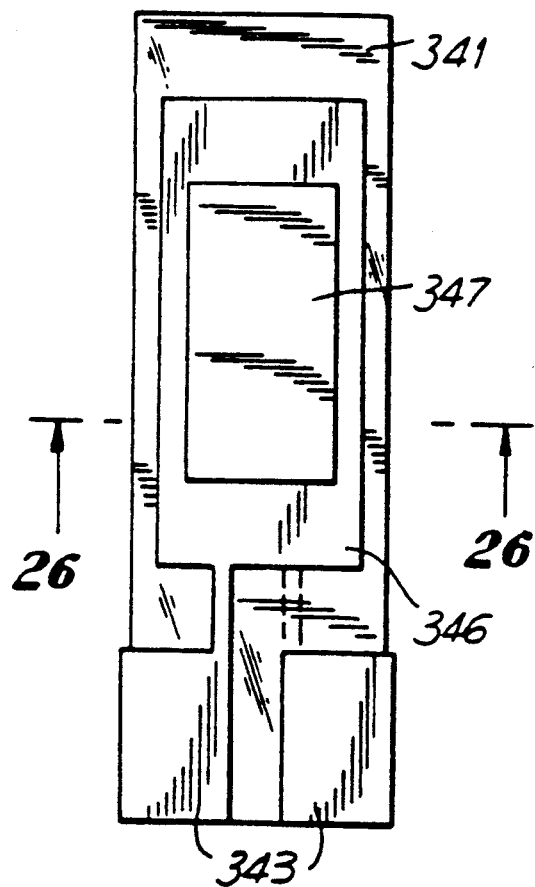
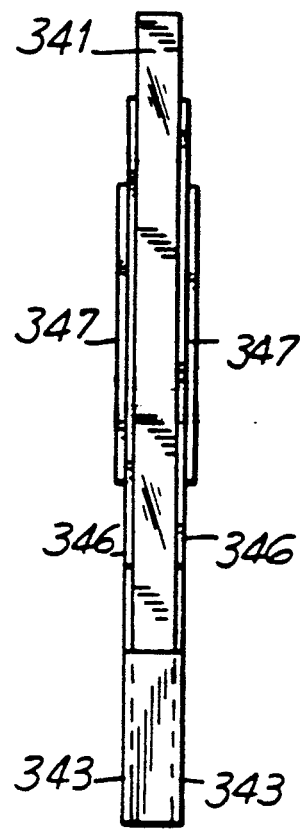
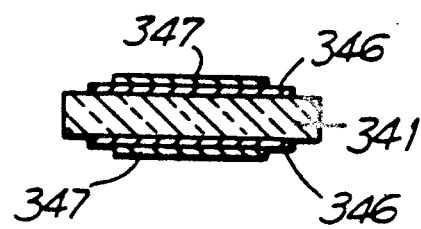
FIG. 26

FIG. 27
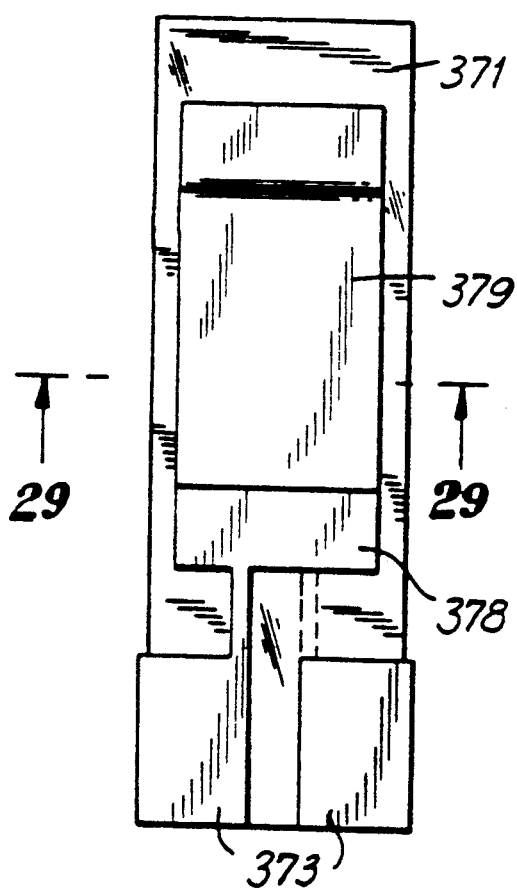
FIG. 28
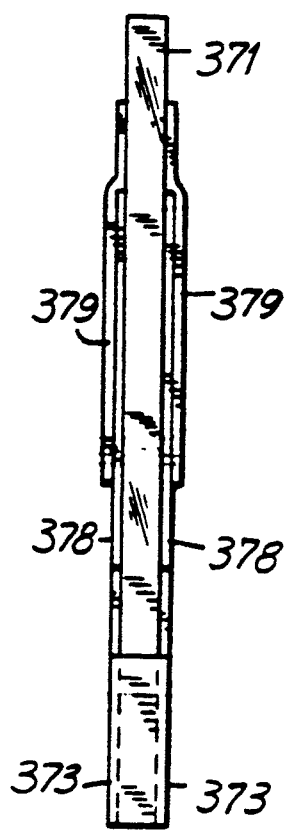
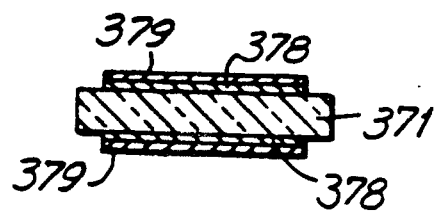
FIG. 29

FIG. 30
FIG. 31
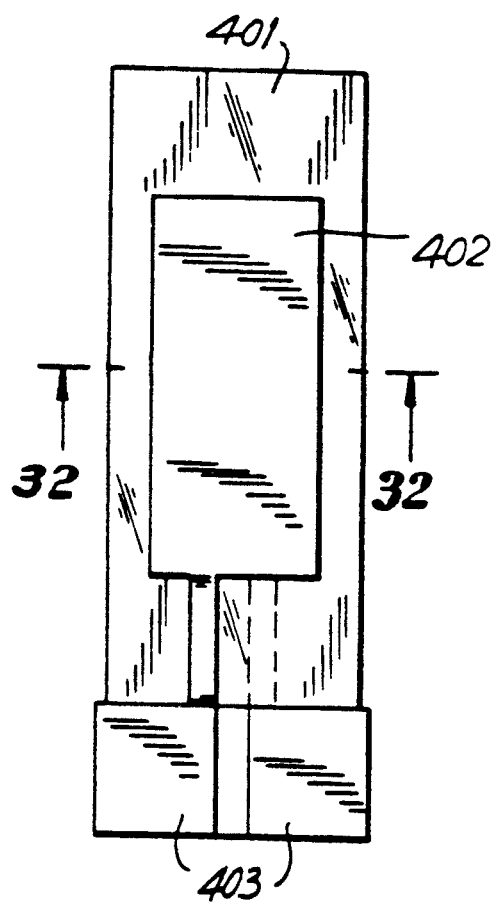
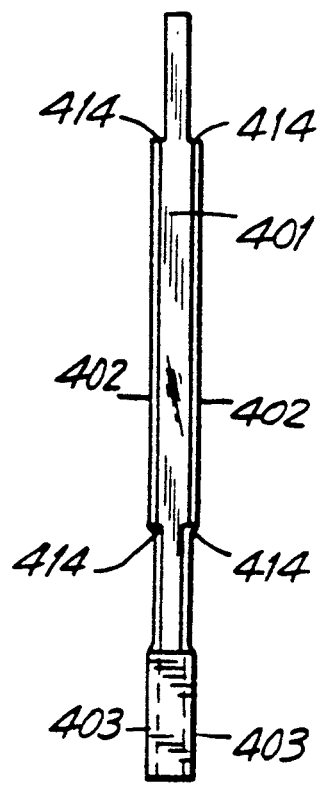
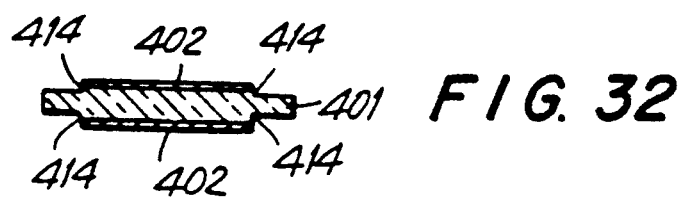
FIG. 32

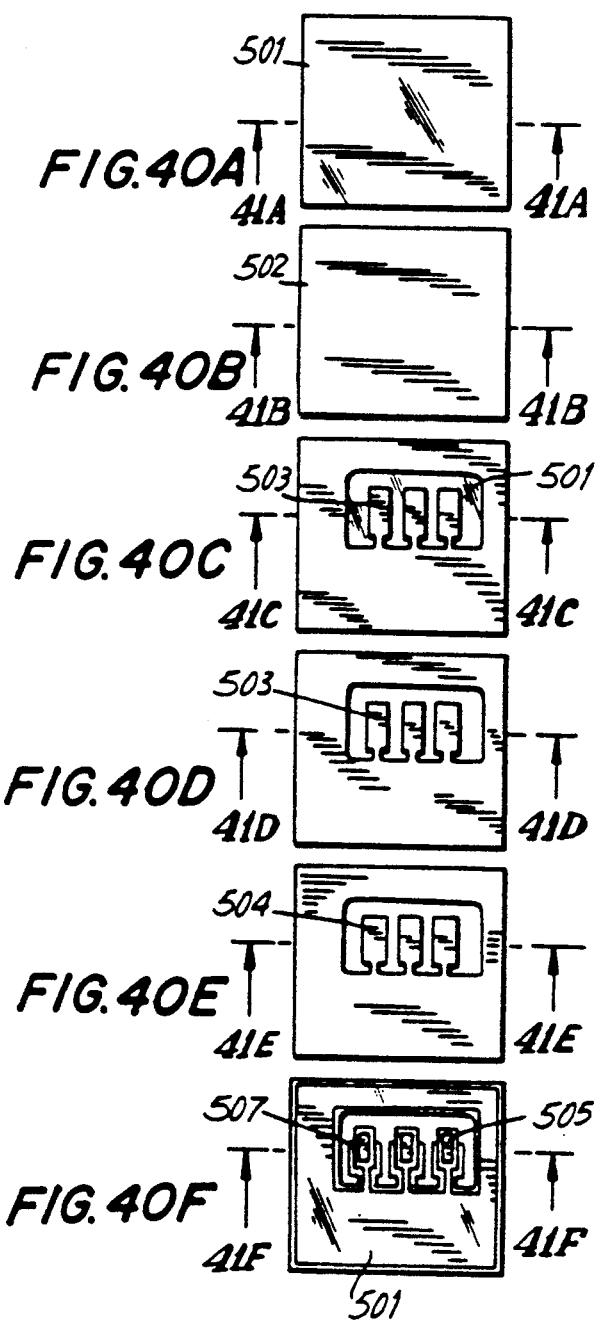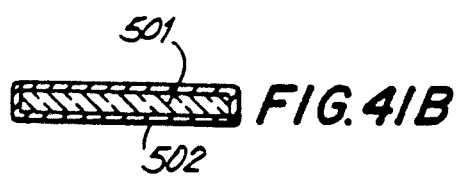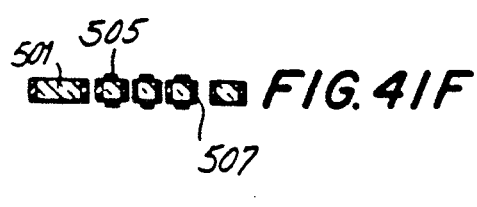

AT-CUT CRYSTAL OSCILLATING REED AND METHOD OF ETCHING THE SAME

This is a division of application Ser. No. 07/691,888, filed on Apr. 26, 1990, and now abandoned, entitled AT-Cut Crystal Oscillating Reed and Method of Etching the Same.

BACKGROUND OF THE INVENTION

This invention relates generally to a crystal oscillating reed and, in particular, to an AT-cut crystal oscillating reed.

Crystal oscillating reeds are well known in the art, as are the particular crystal oscillating reeds known as AT-cut crystal oscillating reeds. Crystal oscillating reeds are used in crystal oscillators. Clocks, computers, and other information communication equipment use crystal oscillators as reference frequency sources.

An example of an AT-cut crystal oscillating reed which is manufactured by a conventional etching method is disclosed in Japanese Patent Laid-Open No. 1-179513. This method of cutting an AT-cut crystal oscillating reed, shown in FIG. 1, is the most frequently used method for cutting a wide variety of crystal oscillating reeds. In FIG. 1, the X, Y and Z-axes denote the initial axial directions, whereas the Z' and Y'-axes denote the novel axial directions. The axial directions are obtained by rotating a parallel cut by an angular degree of $\theta°$.

A cross-sectional view of an AT-cut crystal oscillating reed which has been etched in accordance with the conventional method is shown in FIG. 2. Corrosion resisting films 122a and 122b and 123a and 123b are formed respectively on the upper and lower surfaces of a crystal wafer 121 to prevent unnecessary propagation of the etching. Crystal wafer 121 has a thickness of t. Upper corrosion resisting film 122 has a gap defined by upper ends 124 and 125. Similarly, lower Corrosion resisting film 123 has a gap defined by lower at ends 126 and 127. The interval between ends 124 and 127 is shifted in the Z'-axis direction by $t/\tan\theta°$. Ends 125 and 126 are arranged to have a designated distance from ends 124 and 127, respectively, to maintain a width necessary to perform etching. In this conventional example, the distance between ends 124 and 125 as well as from ends 126 and 127 is arranged to be half the distance of the interval along the Z'-axis between ends 124 and 127, i.e., $t/(2\times\tan\theta)$.

Therefore, in the conventional method, the etching continues from both the upper and lower surfaces of crystal wafer 121 in the direction of the Z-axis until the two etching propagations encounter each other at a position where the thickness of crystal wafer 121 is $t/2$.

This conventional etching method for forming an AT-cut crystal oscillating reed has several disadvantages since the side surfaces (the surface between ends 124 and 126 of corrosion resisting films 122a and 123a, respectively, as well as between ends 125 and 127 of corrosion resisting films 122b and 123b, respectively) are disposed diagonally, i.e., not perpendicular to the corrosion resisting films. Additionally, the side surfaces are not smooth but have two "steps" and sharpened front portions. As a result, undesirable spurious oscillations can be generated, causing the oscillation characteristics to deteriorate. Moreover, the sharpened front portions can easily be broken, and over a long period of time the reliability of the reed will deteriorate. Finally, when this AT-cut crystal oscillating reed is clamped, cracks tend to form in the clamped portion. Thus, the clamped portion is easily broken and satisfactory oscillations cannot be generated.

A typical AT-cut crystal oscillating reed on which an electrode film has been formed is shown in FIGS. 3–5. Crystal oscillating reed 131 has two main surfaces 134 on the front and back thereof, as well as two side surfaces 135. Exciting electrodes 132 are formed on the main surfaces 134 of crystal oscillating reed 131. Electrodes 133, which are for establishing a connection with external equipment, are each formed on both main surfaces 134 and around side surfaces 135 so that the two main surfaces 134 of AT-cut crystal oscillating reed 131 are electrically connected to each other. Exciting electrodes 132, however, do not extend to the side surfaces 135. One of the external connection electrodes 133 is connected to each exciting electrode 132.

To form the electrodes, crystal oscillating reed 131 is positioned in a metal mask with apertures shaped in the form of the electrodes. Chrome and silver metals are then deposited on the metal mask and through the apertures to crystal oscillating reed 131.

When a voltage is applied to crystal oscillating reed 131 by external connection electrodes 133 which are connected to external equipment, an electric field is generated between exciting electrodes 132 so that crystal oscillating reed 131 is oscillated. Exciting electrodes 132 also act to confine the oscillation energy.

This conventional crystal oscillating reed 131 is less than completely satisfactory, however, because as the size of the oscillating reed is reduced, the crystal impedance (hereinafter, the "CI value") becomes excessively large. This occurs because the oscillation energy cannot be satisfactorily confined by the overlap effect of exciting electrodes 132.

Moreover, during electrode formation which utilizes the metal mask, satisfactory adhesion is difficult to obtain between the crystal oscillating reed and the mask. As a result, a clear contour and desired positional accuracy between crystal oscillating reed 131 and the metal mask is difficult to achieve, and so the crystal reed characteristics will not be uniform.

Accordingly, a method of etching an AT-cut crystal oscillating reed, an AT-cut crystal oscillating reed, and a method of forming electrodes on an AT-cut crystal oscillating reed which overcomes the problems of the conventional etching methods and reeds outlined above is desired.

SUMMARY OF THE INVENTION

Generally speaking, in accordance with the invention, an AT-cut crystal oscillating reed formed by etching an AT-cut crystal wafer is provided. The wafer has a rotational parallel cut obtained by rotating a parallel cut by an angular degree of $\theta°$ relative to the X-axis of the wafer. The etching cross-section of the AT-cut crystal oscillating reed has a surface at an angle about 90° from the front or back surface of the AT-cut crystal oscillating reed. Preferably, $\theta$ is between about 35° and 40°.

Also provided is an AT-cut crystal oscillating reed with a low CI value including a crystal oscillating segment with a front, a back and side surfaces. The reed includes at least one external connection electrode, formed on a portion of the crystal designated the mount portion, which is capable of being connected to an external energy source. Also included is a pair of opposed exciting electrodes formed on the front and back surfaces, respectively, of the crystal at a portion of the crystal designated the main oscillating portion. The exciting electrodes are connected to the at least one external connection electrode. The width of the mount portion is different from the width of the main oscillating portion to inhibit the transfer of oscillating energy therebetween.

In another AT-cut crystal oscillating reed according to the invention, the mount portion has an essentially rectangular cross-section and the upper portion of the main oscillating portion is electrode-free and has a cross-section essentially in the shape of a parallelogram.

Also provided is an AT-cut crystal oscillating reed, wherein each exciting electrode includes first and second metal layers which only partially overlap. The first metal layer may have less surface area than the second metal layer and be positioned underneath the second metal layer. Alternatively, the first metal layer has less surface area than the second metal layer and is positioned above the second metal layer. In another embodiment, the first metal layer has the same surface area as the second metal layer and a portion of the first metal layer overlaps the second metal layer.

In another AT-cut crystal oscillating reed which has a low CI value, the portion of the crystal interposed between the opposed exciting electrodes is thicker than at least the immediately surrounding portions of the crystal.

Still another AT-cut crystal oscillating reed additionally includes at least two side electrodes which are positioned on and extend substantially up two opposed elongated side surfaces of the segment. The side electrodes are also connected to the external connection electrode.

Also provided is a method of etching an AT-cut crystal oscillating reed from an AT-cut crystal wafer. An AT-cut crystal wafer is provided which has a front and back surface with a rotational parallel cut obtained by rotating a parallel cut by an angular degree of $\theta°$ relative to the X-axis of the wafer. Corrosion resisting films are formed on the front and back surfaces of the crystal wafer, and these corrosion resisting films have gaps at the portion of the wafer to be etched for forming the AT-cut crystal oscillating reed. Finally, the wafer is etched to form the side edges of an AT-cut crystal oscillating reed. These side edges are at an angle of about 90° from the front or back surface of the AT-cut crystal oscillating reed. The etching may include wet etching utilizing hydrofluoric acid, or dry etching.

In a preferred embodiment, the thickness of the wafer is designated t, the width of the gaps in the corrosion resisting films is designated l, and $l \geq t/\tan \theta$.

In still another embodiment, the corrosion resisting films are metal films and may be formed into exciting electrodes. This may be accomplished by coating the metal corrosion resisting films with a photoresist material, placing a photomask with the desired exciting electrode patterns on the photoresist material, exposing the photoresist material to light, and developing the photoresist material to shape the metal corrosion resisting films into exciting electrodes.

Accordingly, it is an object of the invention to provide an improved method of etching an AT-cut crystal oscillating reed.

Another object of the invention is to provide an improved AT-cut crystal oscillating reed.

A further object of the invention is to provide an AT-cut crystal oscillating reed which is formed by etching and has a side surface substantially perpendicular to the surface of the corrosion resisting film.

Yet another object of the invention is to provide a crystal oscillating reed which has a low CI value even if the reed is small.

Still another object of the invention is to provide an AT-cut crystal oscillating reed which exhibits uniform characteristics and excellent reliability.

An additional object of the invention is to provide a method of manufacturing AT-cut crystal oscillating reeds in which the reeds may be mass produced at a relatively low cost.

Still other objects and advantages of the invention will in part be obvious and will in part be apparent from the specification.

The invention accordingly comprises the several steps and the relation of one or more of such steps with respect to each of the others, and the article possessing the features, properties and the relation of elements, which are exemplified in the following detailed disclosure, and the scope of the invention will be indicated in the claims.

DESCRIPTION OF THE DRAWINGS

For a fuller understanding of the invention, reference is had to the following description taken in connection with the accompanying drawings, in which:

FIG. 24 is a top plan view of an AT-cut crystal oscillating reed in accordance with a tenth embodiment of the invention;

FIG. 25 is a side elevational view of the crystal oscillating reed of FIG. 24;

FIG. 26 is a cross-sectional view taken along line 26—26 of FIG. 24;

FIG. 27 is a top plan view of an AT-cut crystal oscillating reed in accordance with an eleventh embodiment of the invention;

FIG. 28 is a side elevational view of the crystal oscillating reed of FIG. 27;

FIG. 29 is a cross-sectional view taken along line 29—29 of FIG. 27;

FIG. 30 is a top plan view of an AT-cut crystal oscillating reed in accordance with a twelfth embodiment of the invention;

FIG. 31 is a side elevational view of the crystal oscillating reed of FIG. 30;

FIG. 32 is a cross-sectional view taken along line 32—32 of FIG. 30;

FIGS. 40A–40F are top plan views illustrating steps of forming a series of crystal oscillating reeds;

FIGS. 41A–41F are cross-sectional views taken along lines 41A—41A through 41F—41F of FIGS. 40A–40F, respectively;

DESCRIPTION OF THE PREFERRED EMBODIMENTS

The steps of etching an AT-cut crystal oscillating reed in accordance with a first embodiment of the invention is depicted with reference to FIGS. 6A–6D. Crystal wafer 161 is an AT-plate obtained by a cutting method which is similar to the conventional technology. Crystal wafer 161 is obtained by rotating a parallel cut by an angular degree of $\theta°$ relative to the X-axis. Preferably, $\theta°$ is between about $+35°$ and $+40°$. Crystal wafer 161 is cut from a rough crystal, and its contour is shaped before the surface is polished. Axes Z' and Y' are novel axial directions.

Figure 6A:
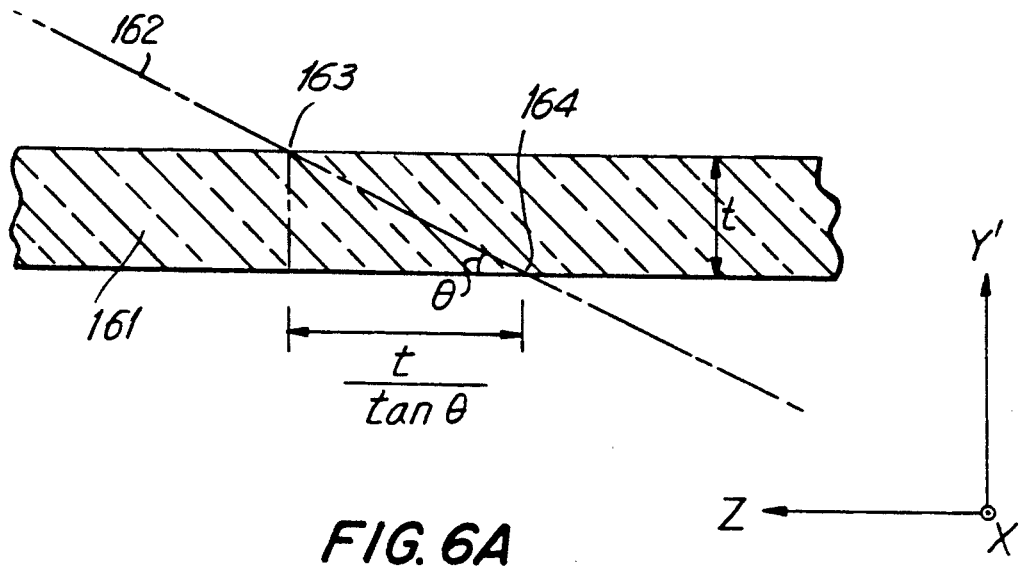
FIGS. 6A–6D are cross-sectional views showing the steps of formation of an AT-cut- crystal oscillating reed in accordance with a first embodiment of the invention.
Figure 6B:
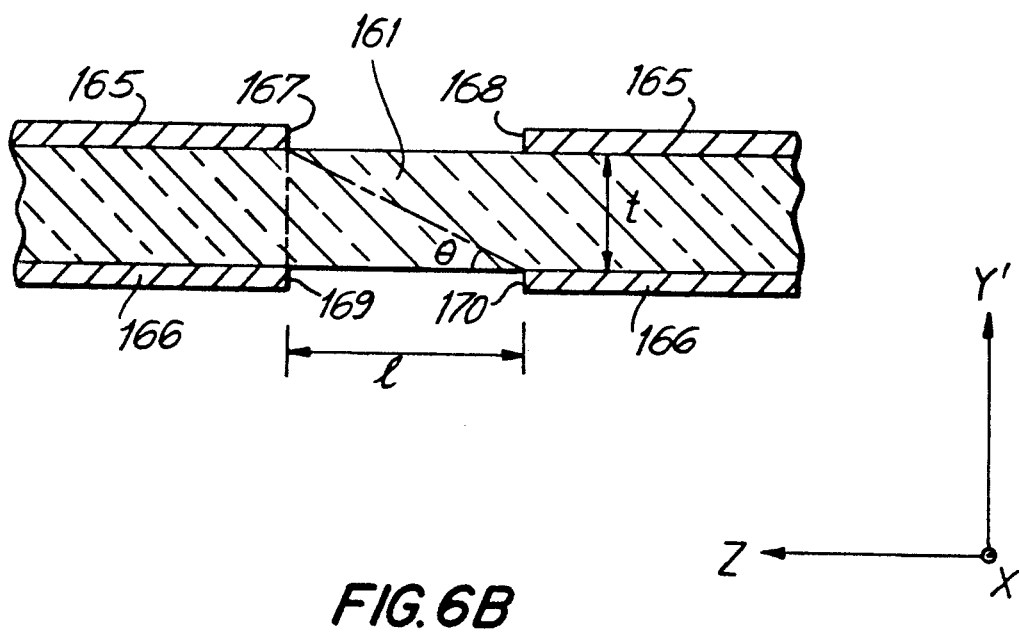

Referring to FIG. 6B, the upper and lower surfaces of crystal wafer 161 have corrosion resisting films (i.e., etching resisting films) 165 and 166, respectively, which are formed by evaporating, sputtering or plating metals such as chromium or gold. Corrosion resisting films 165 and 166 each have a gap for use when etching crystal wafer 161. The gaps are defined by upper ends 167 and 168 of upper corrosion resisting film 165, and by lower ends 169 and 170 of lower corrosion resisting film 166. The gaps are formed by a photoetching method using a photoresist and etching liquid such as aqua regia. As seen in FIG. 6B, in this embodiment the gaps are essentially aligned.

The thickness of crystal wafer 161 is defined as t. A line drawn between upper end 167 and lower end 170 is substantially the direction of the Z-axis, and the component of the line which is in the direction parallel to the Z'-axis has a length designated l. In this embodiment, l equals $t/\tan \theta°$, and l is also the distance from upper end 167 to upper end 168 and well as from lower end 169 to lower end 170. Also in this embodiment, since the line which establishes a connection between upper end 167 and lower end 170 overlaps the Z-axis, upper end 167 also overlaps upper intersection 163 of the crystal while lower end 170 overlaps lower intersection 164 of the crystal.

Figure 6C:
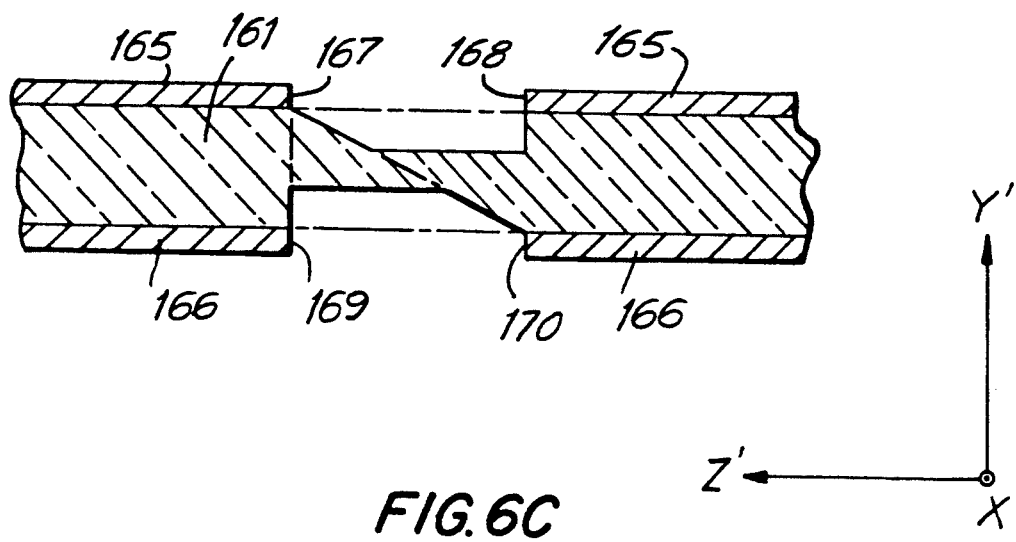

The crystal wafer shown in FIG. 6B is then subjected to etching by an etching liquid such as a mixture of a hydrofluoric acid solution and ammonium fluoride solution. As a result, a trapezoid-like cross-sectional shape is formed as shown in FIG. 6C in which the lower surface of the trapezoid-like shape is parallel to the surface of the wafer, and the side surfaces of the shape are at angles from the surface of the wafer of approximately 90° and $\theta°$, respectively.

Figure 6D:
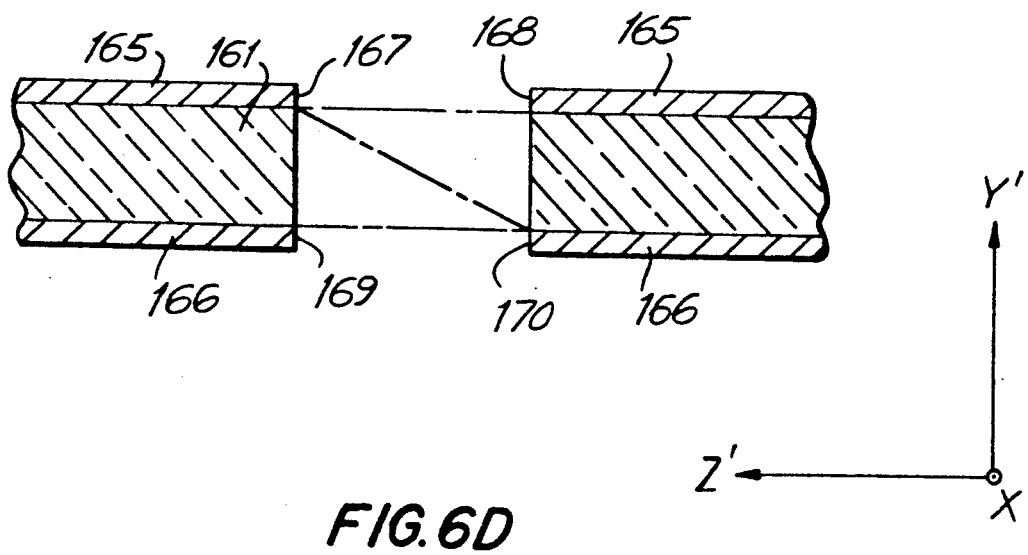

The etching is continued as depicted in FIG. 6D until the two trapezoid-like cross-sectional shapes merge, leaving only the side surface at an angle of approximately 90° from the surface of wafer 161. As a result of this etching operation, an AT-cut crystal oscillating reed with a flat side surface is obtained. This side surface is used as the end surface of the oscillating reed.

Since these side surfaces are flat and have no steps, the resulting AT-cut crystal oscillating reed has excellent vibration characteristics, is reliable and can be maintained for a long period of time, and exhibits significant resistance to impact.

In the embodiments shown in FIGS. 6A-6D, the lengthwise component l, which is parallel to the Z'-axis, is equal to t/tan θ°, where t is the distance from upper end 167 to lower end 170, the thickness of the crystal length. As noted previously, this is also the length of the gap between upper ends 167 and 168 as well as of the gap between lower ends 169 and 170. Therefore, there is no deviation between the upper end 167 and lower end 169 as well as between upper end 168 and lower end 170. The advantage of this continuity is that the upper and lower masks are more easily aligned to each other during photoetching.

It is necessary for l to be t/tan θ° or longer, while the gap between upper ends 167 and 168 and between lower ends 169 and 170 must be l or longer. In this way, the necessity for the gap between upper ends 167 and 168 and the gap between lower ends 169 and 170 to be the same can be eliminated. The gaps may be different from each other if they each exceed l.

Figure 7A:
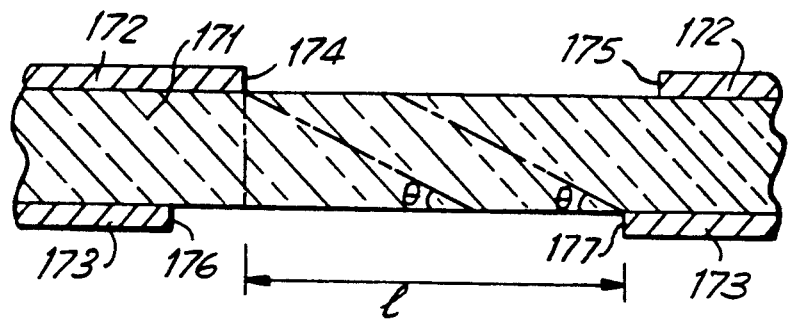
FIGS. 7A–7C are cross-sectional views showing the steps of formation of an AT-cut crystal oscillating reed in accordance with a second embodiment of the invention.
Figure 7B:
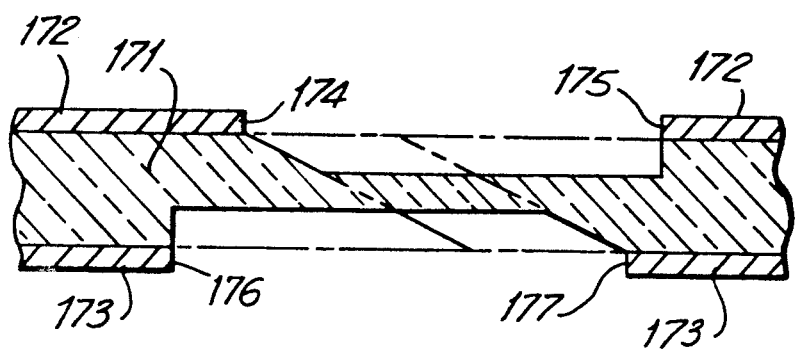
Figure 7C:
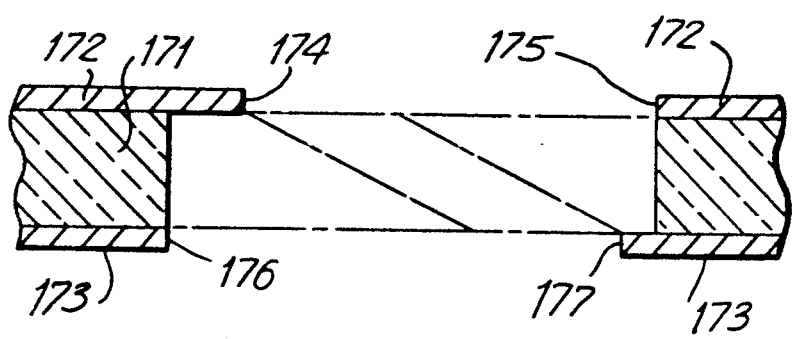

FIGS. 7A-7C show such an example in accordance with a second embodiment of the invention where the gaps between the upper and lower corrosion resisting films are wider. The etching is continued until the side surfaces of the crystal oscillating reeds are at an angle of about 90° from crystal wafer 171, as shown in FIG. 7C. The width of the AT-cut crystal oscillating reed is determined depending upon the position of upper end 175 and lower end 176

Figure 8:
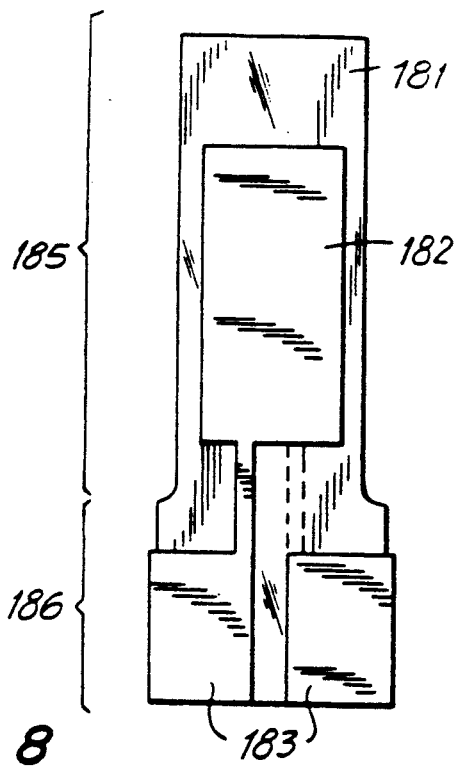
FIG. 8 is a top plan view of an AT-cut crystal oscillating reed in accordance with a third embodiment of the invention.
Figure 9:
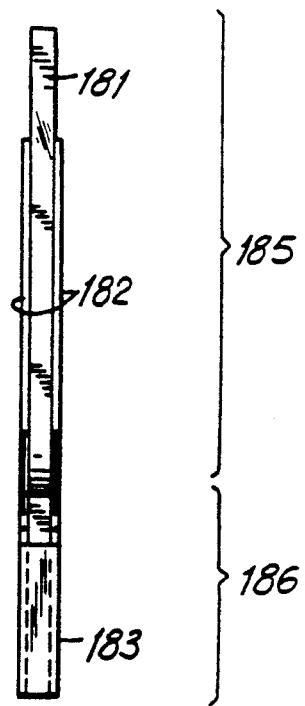
FIG. 9 is a side elevational view of the AT-cut crystal oscillating reed of FIG. 8.

An AT-cut crystal oscillating reed according to a third embodiment of the invention is shown in FIGS. 8 and 9. Crystal oscillating reed 181 is cut at a predetermined angle to a predetermined thickness. Exciting electrodes 182 are formed on the front and back sides of crystal oscillating reeds 181. External-connecting electrodes 183 are for establishing a connection with external equipment. When voltage is applied from external equipment to electrodes 183, an electric field is established between exciting electrodes 182 which oscillates crystal oscillating reed 181.

The portion of the oscillating reed which is dedicated to exciting electrodes 182 is designated the main oscillating portion 185. The portion of oscillating reed 181 which is dedicated to external connection electrodes 183 is called the mount portion 186. Main oscillating portion 185 has the same width as a conventional rectangular AT-cut crystal oscillating reed. However, the width of mount portion 186 is larger than main oscillating portion 185. With this configuration, oscillations generated in main oscillating portion 185 are not transmitted to mount portion 186 since the characteristic frequency of the oscillation changes at the boundary of mount portion 186 where the width dimension changes. The prevention of oscillation transmission significantly reduces planar slide oscillations, or sub-oscillations. Thus, the oscillation energy can be even more confined to main oscillating portion 185 so that the CI value is improved.

Another advantage of this embodiment is that AT-cut crystal oscillating reeds with different frequencies can nevertheless have the same mount portion width. To alter the frequency, only the width of main oscillating portion 185 needs to be varied. Thus, the width of mount portion 186 may be standardized for simplification of mass production and positioning.

Figure 10:
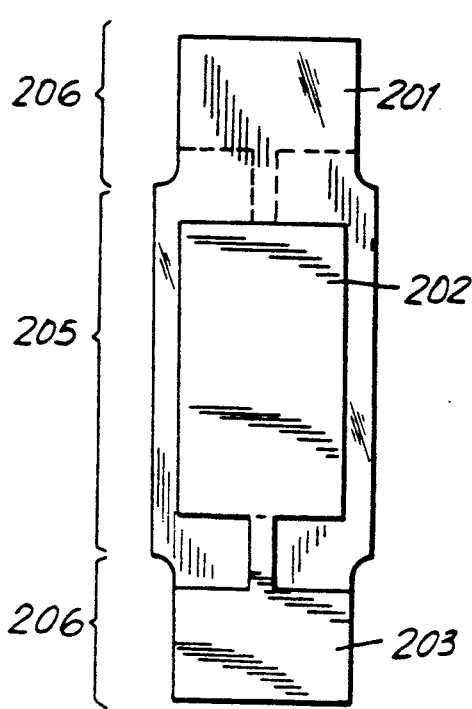
FIG. 10 is a top plan view of an AT-cut crystal oscillating reed in accordance with a fourth embodiment of the invention.
Figure 11:
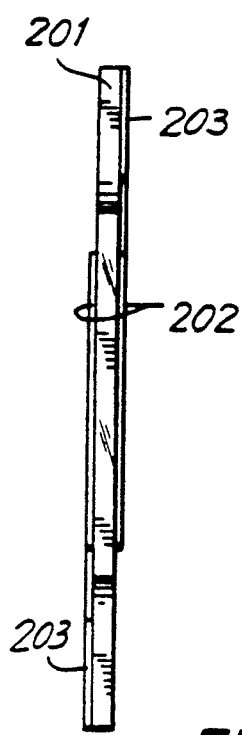
FIG. 11 is a side elevational view of the AT-cut crystal oscillating reed of FIG. 10.

An AT-cut crystal oscillating reed according to a fourth embodiment of the invention is shown in FIGS. 10 and 11. Crystal 201 is interdisposed between exciting electrodes 202. However, external connection electrodes 203 are positioned on opposite sides, either front or back, of crystal 201, as well as on opposite ends, either above or below, exciting electrodes 202. Each of external connection electrodes 203 is carried by its own mount portion 206. In this embodiment, two ends of the crystal oscillating reed are connected and supported by external equipment instead of just one.

The width of each of the mount portions 206 is arranged to be smaller than the width of main oscillating portion 205. With this width variance, effects similar to those described for FIGS. 8 and 9 may be obtained.

Figure 12:
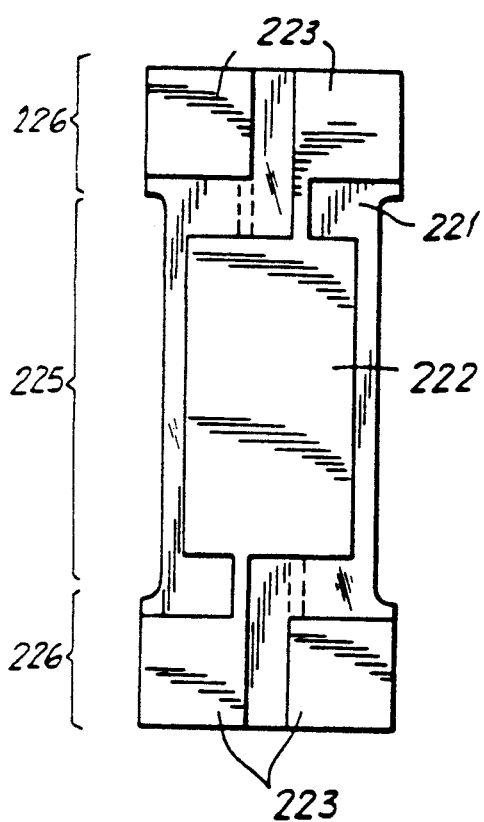
FIG. 12 is a top plan view of an AT-cut crystal oscillating reed in accordance with a fifth embodiment of the invention.

An AT-cut crystal oscillating reed according to a fifth embodiment of the invention is shown in FIG. 12. External connection electrodes 223 are positioned both on the front and back of crystal 221 as well as above and below both exciting electrodes 222. Main oscillating portion 225 is narrower than mount portions 226. This crystal oscillating reed configuration has similar advantages to the embodiment depicted in FIG. 10, but also has the added advantage that it can be mounted without regard to its positional location relative to its top and bottom.

Figure 13:
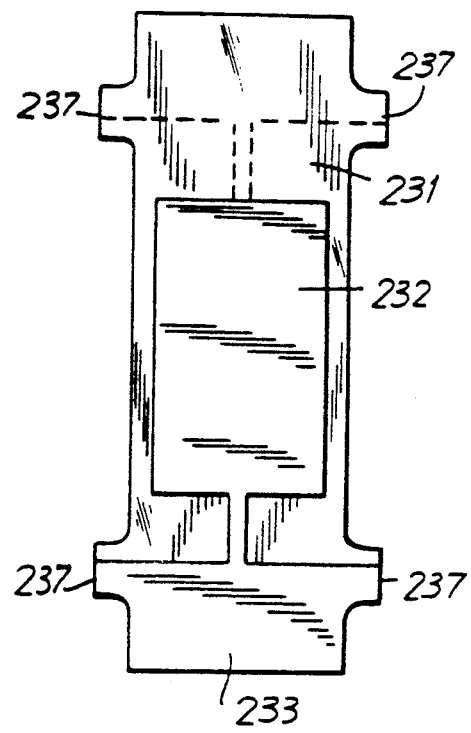
FIG. 13 is a top plan view of an AT-cut crystal oscillating reed in accordance with a sixth embodiment of the invention.

A sixth embodiment in accordance with the invention is shown in FIG. 13. One external connection electrode 233 is positioned on the front of crystal 231 and below exciting electrode 232, while the other external connection electrode 233 is positioned on the back of crystal oscillating reed 231 and above exciting electrode 232. The main difference of this embodiment is the presence of projections 237 which effectively act to position in the lateral direction. The projections, located at the juncture of the mount and main oscillating portions, also serve to achieve the effects described with regard to FIGS. 8 and 9. Additionally, projections 237 act as a guide when mounting the crystal oscillating reed to a slitted terminal for establishing a connection with external equipment.

Figure 15:
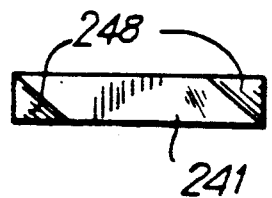
FIG. 15 is an end elevational view of the AT-cut crystal oscillating reed of FIG. 14.
Figure 14:
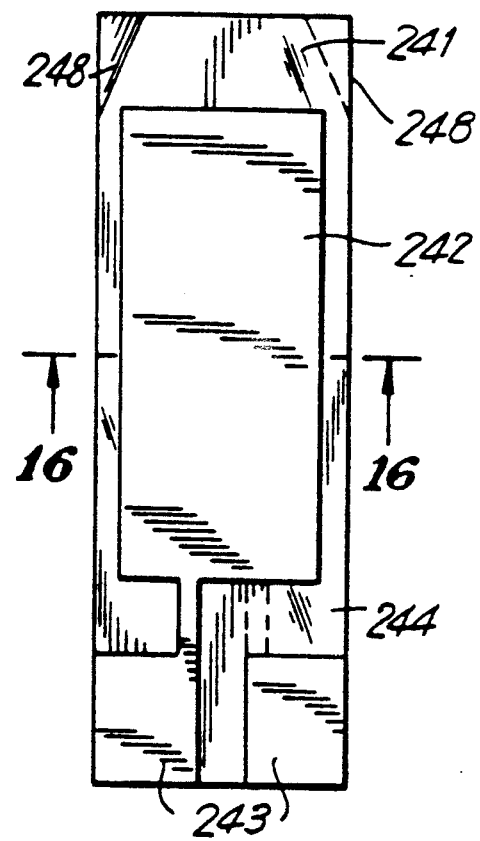
FIG. 14 is a top plan view of an AT-cut crystal oscillating reed in accordance with a seventh embodiment of the invention.
Figure 16:
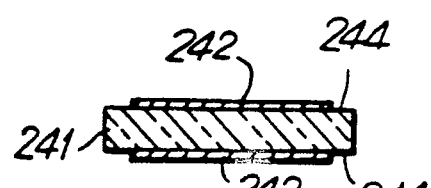
FIG. 16 is a cross-sectional view taken along lines 16—16 of FIG. 14.

An AT-cut crystal oscillating reed in accordance with a seventh embodiment of the invention is shown in FIGS. 14-16. Exciting electrodes 242 are positioned on front and back main surfaces 244 of crystal 241. External connection electrodes 243 are mounted on the front, back and side surfaces of the crystal in a single mount portion for connection with external equipment. As shown in FIGS. 14 and 15, the shape of the upper end of crystal 241 (on the other end of the crystal from the mount portion) is in the form of a parallelogram. The parallelogram shape is formed by the sloping portions 248 which incline from the regular rectangular cross-section shown in FIG. 16.

Figure 1:
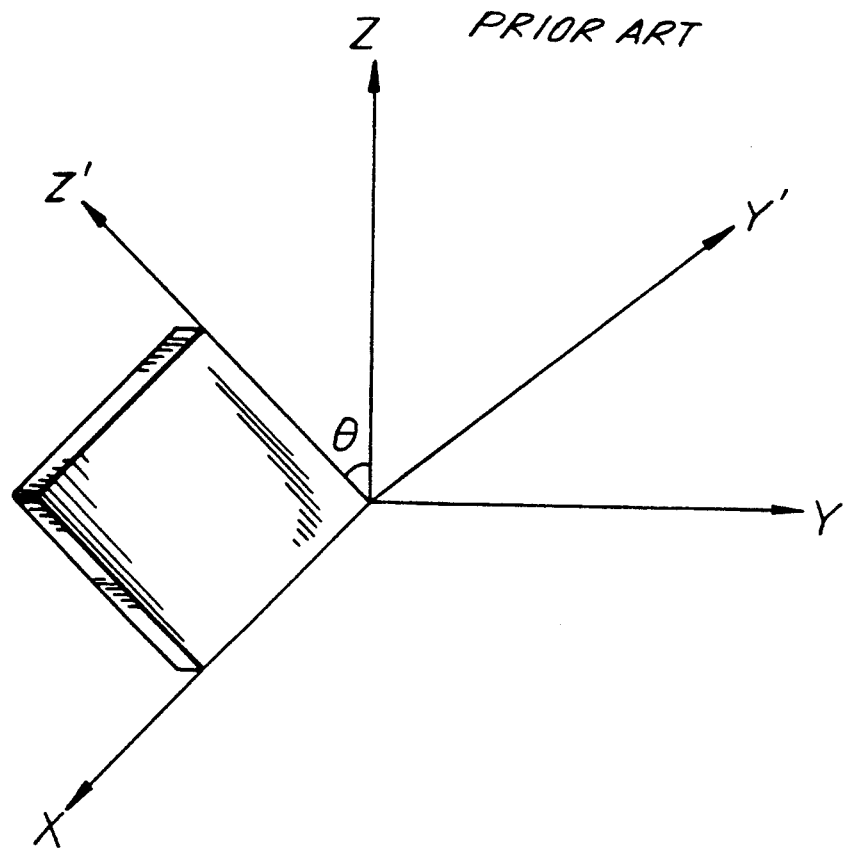
FIG. 1 illustrates the relationship between spatial axes of a crystal wafer to be AT cut.
Figure 2:
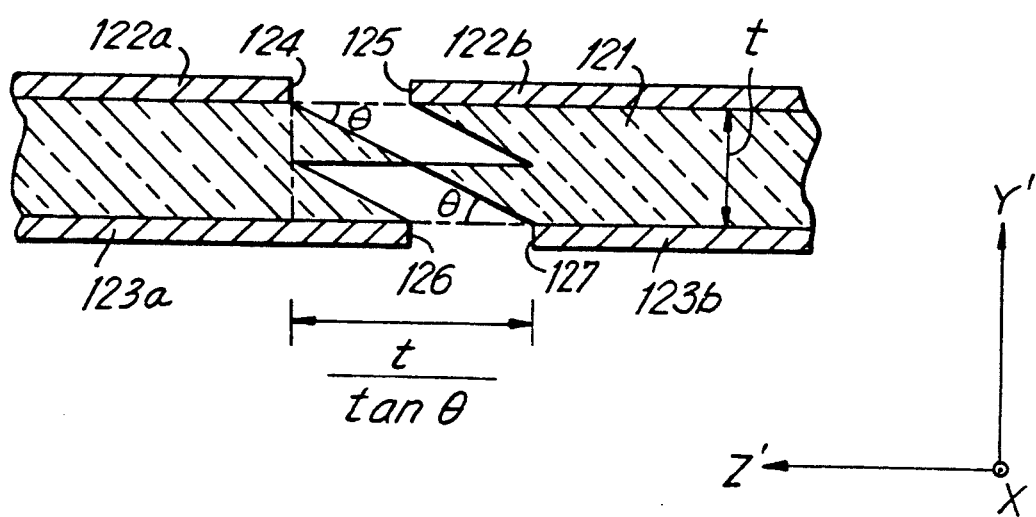
FIG. 2 is a cross-sectional view of a conventional AT-cut crystal wafer.
Figure 3:
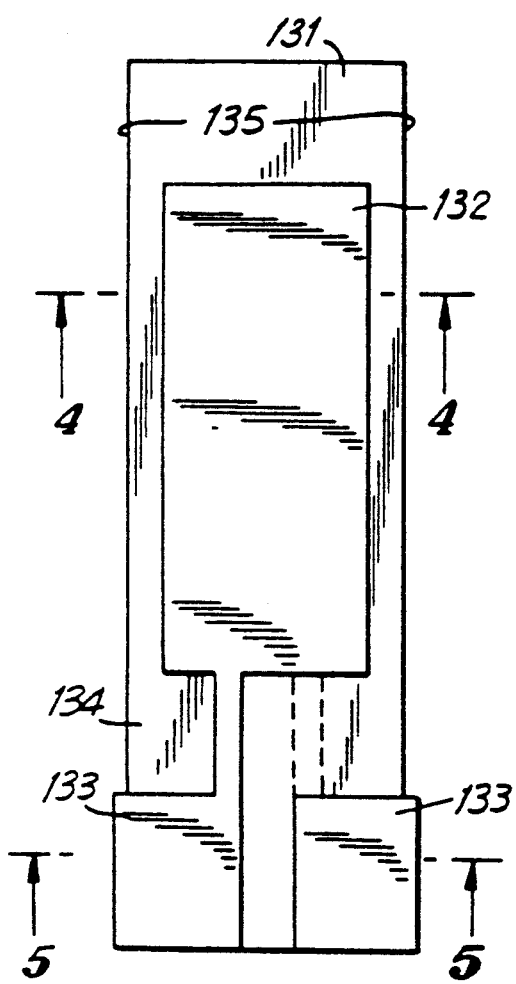
FIG. 3 is a top plan view of a conventional AT-cut crystal oscillating reed.

The oscillation frequency in the exciting electrodes 242 and the initial oscillation energy are the same as those of the conventional rectangular AT-cut crystal oscillating reed shown in FIG. 3. However, due to the sloped portions 248, the oscillations are not easily transmitted to the upper end of crystal oscillating reed 241. This occurs because characteristic frequency is dependent on the thickness of crystal oscillating reed 241 and so oscillation energy cannot easily be transmitted to portions having a different thickness. This results from the fact that an AT-cut crystal oscillator generates oscillations in the thickness slide manner. Therefore, in crystal oscillating reed 241, the energy undesirably discharged from the end surface is reduced, while a satisfactorily large quantity of energy is confined between exciting electrodes 242. Therefore, crystal oscillating reed 241 has a low CI value.

Figure 18:
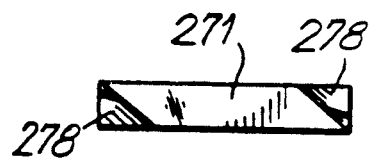
FIG. 18 is an end elevational view of the AT-cut crystal oscillating reed of FIG. 17.
Figure 17:
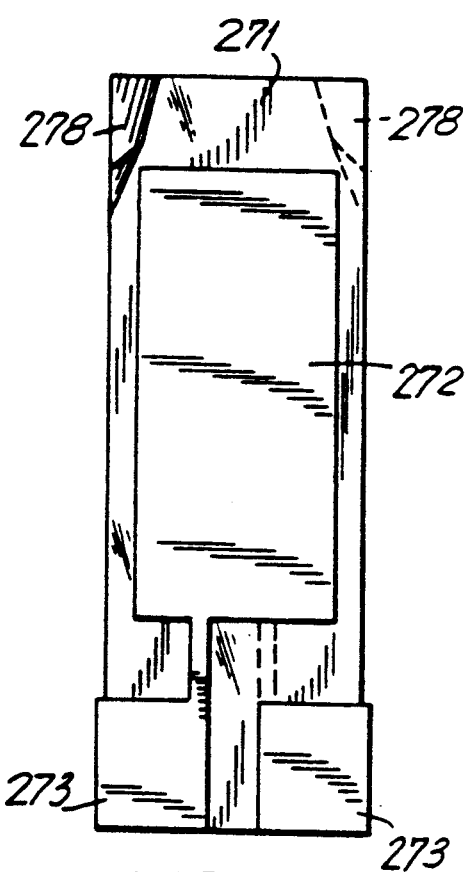
FIG. 17 is a top plan view of an AT-cut crystal oscillating reed in accordance with an eighth embodiment of the invention.
Figure 19:
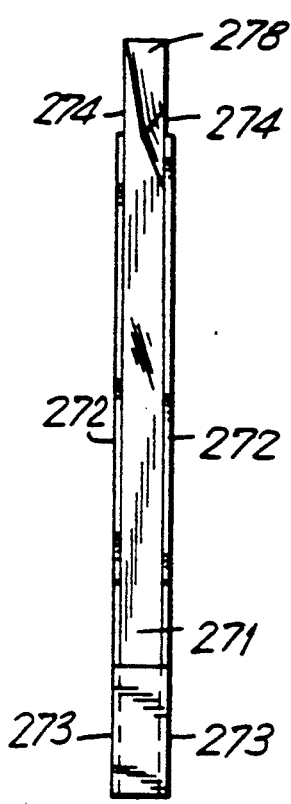
FIG. 19 is a side elevational view of the crystal oscillating reed of FIG. 17.

Another AT-cut crystal oscillating reed which has varying thickness in accordance with an eighth embodiment of the invention is shown in FIGS. 17-19. Exciting electrodes 272 are disposed on opposed main surfaces 274 of crystal 271. External connection electrodes 273 are disposed on a single mount portion on the main and side surfaces of the crystal for connecting to external equipment. Sloping portions 278 also change the cross-sectional shape from rectangular to a parallelogram. However, the angle of sloping portions 278 changes at one point to further inhibit the escape of oscillation energy from crystal oscillating reed 271. The separate segments or facets of sloping portions 278 are equivalent to other crystal facets, which is consistent since oscillating reed 271 is made of crystal.

Figure 20:
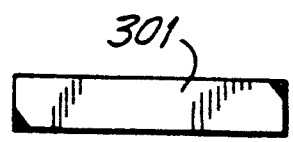
FIG. 20 is an end elevational view of a crystal oscillating reed which has been partially etched.

The facets may be formed by etching, using an etching liquid such as hydrofluoric acid. Corrosion resisting films are deposited on the surfaces of the crystal which is to define the planar main surfaces 274. Since crystal 271 has a crystal structure, facets corresponding to specific crystal faces are defined by the etching. FIG. 20 illustrates the upper end surface of a crystal 301 in a state where etching is being performed. The time in which etching is performed is set so as to make the end surface in the shape of a parallelogram, as shown in FIG. 18. When the AT-cut oscillating reed shown in FIGS. 14-16 is manufactured by machine, the rectangular oscillating reed must be cut and then the front portion must be ground. However, the AT-cut crystal oscillating reed, as shown in FIGS. 17-19, can be manufactured by etching without an increase in the number of manufacturing steps. A plane which is substantially perpendicular to the main surface 274 of crystal oscillating reed 271 is used as the end surface.

Figure 21:
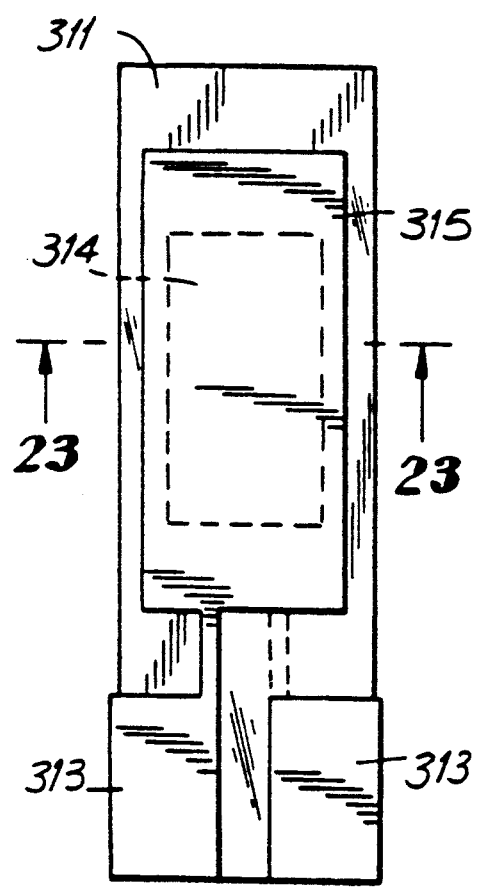
FIG. 21 is a top plan view of an AT-cut crystal oscillating reed in accordance with a ninth embodiment of the invention.
Figure 22:
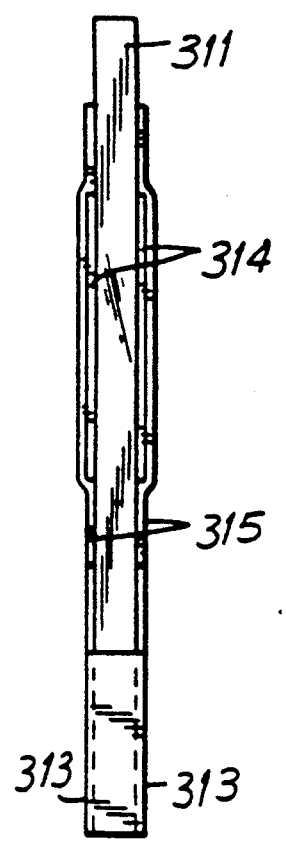
FIG. 22 is a side elevational view of the crystal oscillating reed of FIG. 21.
Figure 23:
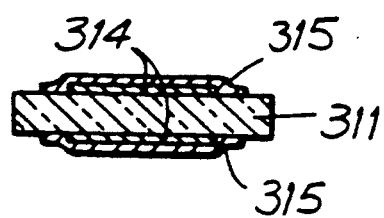
FIG. 23 is a cross-sectional view taken along line 23—23 of FIG. 21.

An AT-cut crystal oscillating reed in accordance with a ninth embodiment of the invention is shown in FIGS. 21-23. Crystal oscillating reed 311 is cut at a predetermined angle to have a predetermined thickness. First metal films 314 are formed on the central portion of each main surface region of crystal oscillating reed 311. Second metal films 315 are stacked on first metal film 314. External connection electrodes 313 are in a mount portion on one side of the oscillation portion for establishing a connection with external equipment.

First metal films 314 are formed by evaporating or sputtering chrome and subsequently evaporating or sputtering gold. Second metal films 315 and external connection electrodes 313 are formed by evaporating or sputtering chrome and subsequently evaporating or sputtering silver.

Voltage is applied to crystal oscillating reed 311 from a connection between external equipment and external connection electrodes 313. First and second metal films 314 and 315 together act as exciting electrodes so that an electric field is generated between the front and back sides of crystal oscillating reed 311. Crystal 311 oscillates at a characteristic frequency. The portion of crystal 311 which is between first and second metal films 314 and 315, the portion of crystal 311 which is between second metal film 315 only, and the peripheral portion of crystal 311 which is not between any metal films, each has a different characteristic frequency. Therefore, it is difficult for oscillations generated in the portion of crystal 311 between both first and second metal films 314 and 315 to be transmitted to the portion between second metal films 315 only. Likewise, it is difficult for these oscillations to be transmitted to the portion not surrounded by metal film. Thus, the oscillation energy generated in the crystal oscillating reed 311 portion between both first and second metal films 314 and 315 can be effectively confined, and so crystal oscillating reed 311 has a low CI value.

Another example of an AT-cut crystal oscillating reed with a multiple-metal layer, in accordance with a tenth embodiment of the invention, is shown in FIGS. 24-26. Crystal 341 and external connection electrodes 343 are arranged similarly to those of the crystal oscillating reed shown in FIGS. 21-23. However, second metal films 347 which are stacked on first metal films 346 are smaller than first metal films 346. As in the crystal oscillating reed shown in FIGS. 21-23, first and second metal films 346 and 347 are arranged to function as exciting electrodes. First metal films 346 and external connection electrodes 343 are formed by evaporating chrome and silver. Subsequently, second metal film 347 is formed by evaporating chrome and silver.

As in the AT-cut crystal oscillating reed shown in FIGS. 21-23, the oscillation energy generated by that portion of crystal oscillating reeds 341 interposed between both first and second metal films 346 and 347 is confined to that specific area. Thus, an AT-crystal oscillating reed with a low CI value is obtained.

An AT-cut crystal oscillating reed, according to an eleventh embodiment of the invention, is shown in FIGS. 27-29. Crystal 371 and external connection electrodes 373 are arranged similarly to those shown in FIGS. 21-23. Second metal film 379 is deposited on first metal film 378 as in FIGS. 21-23, except second metal film 379 only overlaps and does not completely cover first metal layer 378. First and second metal films 379 and 378 together perform as an exciting electrode. The portion of crystal 371 which is interposed between both first and second metal layers 379 and 378 generates oscillating energy which is confined to that specific area. Therefore, an AT-cut crystal oscillating reed with a low CI value can be obtained, similar to that shown in FIGS. 21-23 and 24-26.

Although the combination of metal layers depicted in FIGS. 21-29 are formed on rectangularly-shaped crystal oscillating reeds, it is anticipated that such metal layers may be formed on reeds having other shapes. Thus, the invention is not limited to a particular shape. For instance, the present invention could be utilized on a disc-like AT-cut crystal oscillating reed.

An AT-cut crystal oscillating reed according to a twelfth embodiment of the invention is shown in FIGS. 30-32. Crystal 401 is interposed between exciting electrodes 402. External connection electrodes 403 establish a connection with external equipment. Crystal 401 differs from the crystal shown in FIGS. 3-5, however, in that the portions of crystal 401 which are interposed between electrodes 402 or 403 are thicker than the remaining portions of reed 401. Since crystal oscillating reed 401 has a reduced thickness in the portions not interposed between electrodes 402 or 403, steps 414 are formed at the boundary between portions of crystal 401 with varying thicknesses.

The effect of steps 414 is to confine the oscillating energy generated between exciting electrodes 402 to that portion of crystal 401 which is between electrodes 402. This occurs because the characteristic frequency is different between crystal oscillating reeds having different thicknesses and, consequently, oscillations generated in crystal 401 between electrodes 402 cannot be transmitted to the thinner portions beyond the boundary of exciting electrodes 402.

The portion of crystal 401 between external connection electrodes 403 is kept as thick as the portions between electrodes 402 not in an effort to confine oscillating energy, but for ease in manufacture. Crystal oscillating reed 401 can be manufactured by a method similar to the method for manufacturing the conventional AT-cut crystal oscillating reed shown in FIG. 3. As described above, a rough crystal is cut at an angle called the "AT-cut". Subsequently, the crystal is ground to a thickness which is determined by the desired oscillation frequency. Flat surfaces are formed, and metal films are adhered to the designated electrode areas. The process then varies from the conventional process because, while the electrode films are used as corrosion resisting films, crystal 401 is etched to form steps 414. The etching can be carried out by known methods, for example, by wet etching in which hydrofluoric acid is used, or by dry etching.

Figure 33:
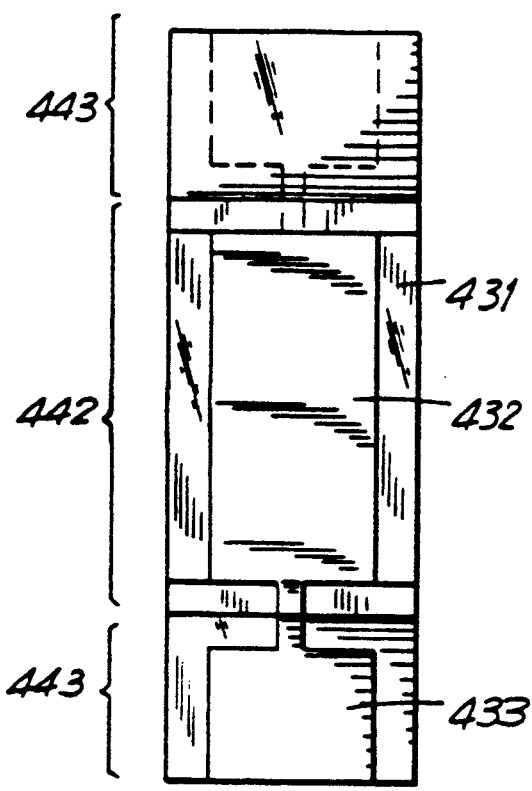
FIG. 33 is a top plan view of an AT-cut crystal oscillating reed in accordance with a thirteenth embodiment of the invention.
Figure 34:
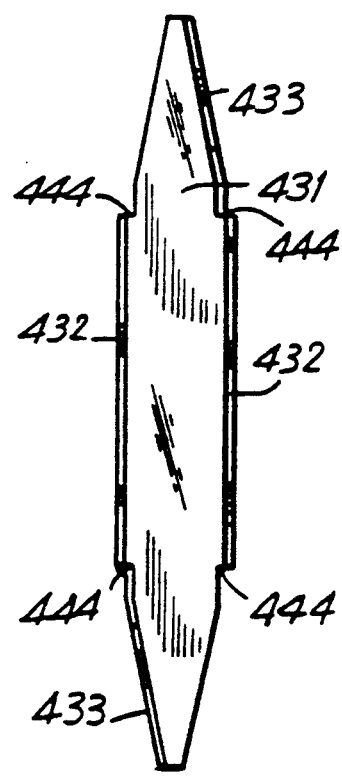
FIG. 34 is a side elevational view of the crystal oscillating reed of FIG. 33.

An AT-cut crystal oscillating reed in accordance with a thirteenth embodiment of the invention is shown in FIGS. 33 and 34. Exciting electrodes 432 are disposed on flat portion 442 of crystal 431. Crystal 431 tapers on either side of flat portion 442 into inclining portions 443. An external connection electrode 433 is disposed on one side of each inclining portion 443. Crystal oscillating reed 431 has steps 444 at the boundary of flat portions 442 and inclining portions 443. Steps 444 serve to inhibit the transmission of oscillating energy as in FIGS. 30-32. This effect is enhanced by the presence of inclining portions 443. Thus, the crystal oscillating reed of FIGS. 33 and 34 has a low CI value.

Crystal 431 may be formed by bevel machining in its lengthwise directional end surface or convex machining.

Figure 35:
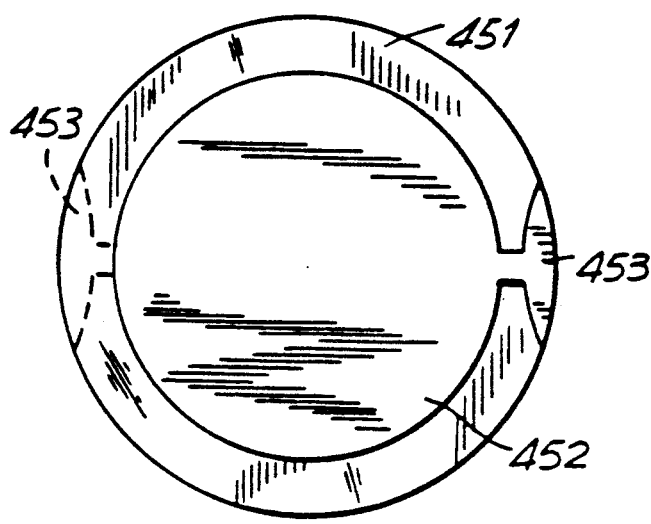
FIG. 35 is a top plan view of an AT-cut crystal oscillating reed in accordance with a fourteenth embodiment of the invention.
Figure 36:
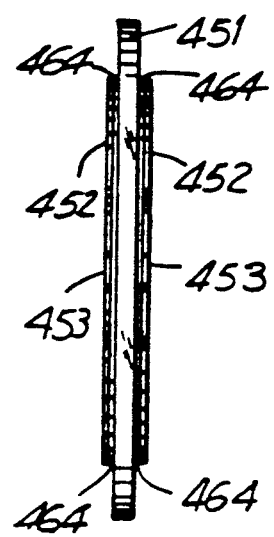
FIG. 36 is a side elevational view of the crystal oscillating reed of FIG. 35.

An AT-cut crystal oscillating reed according to a fourteenth embodiment of the invention is shown in FIGS. 35 and 36. Crystal 451 is in the form of a disc and is interposed between exciting electrodes 452. External connection electrodes 453 are for connection to external equipment. Similar to the crystal oscillating reed shown in FIGS. 30-32, the portion of crystal oscillating reed 451 not interposed between exciting electrodes 452 is thinner so as to confine oscillating energy generated between exciting electrodes 452 to that area. This occurs because steps 464 deter the transmission of oscillating energy.

It is not necessary that the step conform to the boundary of the exciting electrodes, although it is preferred to confine the oscillating energy to the specific electrode portion.

Figure 4:
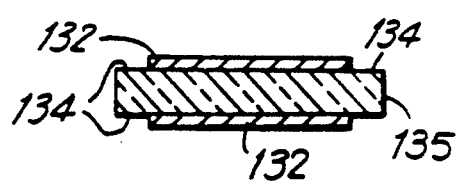
FIG. 4 is a cross-sectional view taken along line 4—4 of FIG. 3.
Figure 5:
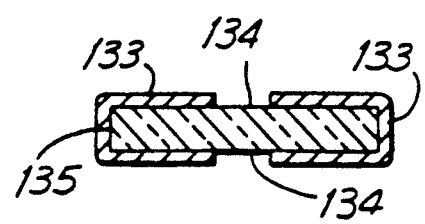
FIG. 5 is a cross-sectional view taken along line 5—5 of FIG. 3.
Figure 37:
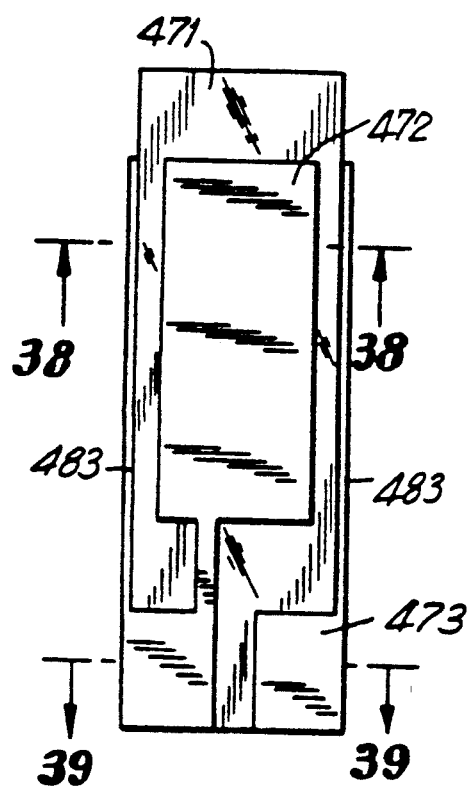
FIG. 37 is a top plan view of an AT-cut crystal oscillating reed in accordance with a fifteenth embodiment of the invention.
Figure 38:
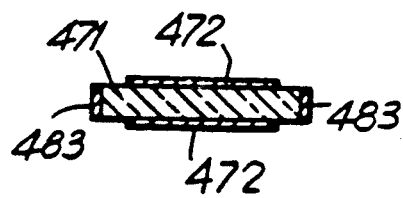
FIG. 38 is a cross-sectional view taken along line 38—38 of FIG. 37.
Figure 39:
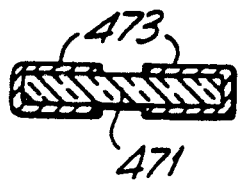
FIG. 39 is a cross-sectional view taken along line 39—39 of FIG. 37.

An AT-cut crystal oscillating reed according to a fifteenth embodiment of the invention is shown in FIGS. 37-39. Crystal 471 is similar to the crystal depicted in FIGS. 3-5. Crystal 471 is disposed between exciting electrodes 472. External connection electrodes 473 are for connection with external equipment. As in the reed shown in FIGS. 3-5, external connection electrodes 473 extend around the sides so that external connection electrodes 473 on the front and back sides of crystal oscillating reed 471 are connected. The difference from the crystal oscillating reed shown in FIGS. 3-5 is that the side portion of external connection electrodes 473 continue upward along the sides of crystal oscillating reed 471 as side electrodes 483. Side electrodes 483 are not connectd at the upper and lower end surfaces of crystal 471.

The steps of manufacturing the crystal oscillating reed shown in FIGS. 37-39 are depicted in FIGS. 40A-40F and 41A-41F. The AT-cut crystal oscillating reeds are manufactured using photo-etching technology. FIGS. 40A and 41A illustrate a crystal wafer 501 which has been formed by cutting a rough crystal and subsequently grinding so as to have a predetermined thickness. The crystal wafer is usually large enough so that a plurality of crystal oscillating reeds can simultaneously be formed from a single wafer. A metal film 502 is formed by sputtering chrome and gold on crystal wafer 501 and shown in FIGS. 40B and 41B. By using a photoresist film 503, metal film 502 is shaped into the multiple reed shape, as shown in FIGS. 40C and 41C. This step is accomplished by using a photomask to make the contour of the reeds into a black and white pattern and then exposing the crystal wafer to light. The photoresist is then developed and the metal film is subjected to etching.

Metal film 502 is then used as a corrosion resisting film to etch the crystal into the desired crystal oscillating reed shapes, as shown in FIGS. 40D and 41D.

Electrode films 504 are next formed as depicted in FIGS. 40E and 41E. Electrode film 504 is formed by removing the photoresist film 503 and metal film 502 and then sputtering or diagonally evaporating either chrome and gold or chrome and silver to form electrode film 504.

Photoresist film is then applied to the crystal wafer on which the electrode film is formed. Then, a photomask arranged into the desired electrode shape is used and the photoresist is exposed to light. After the photoresist is developed, the electrode film is etched and the photoresist material is separated, causing the desired electrode shapes 505, as shown in FIGS. 40F and 41F. Since the photoresist material is diagonally sprayed to the bottom of the crystal oscillating reeds, the photoresist does not adhere to the upper end surfaces of the crystal oscillating reeds. Therefore, the electrode film which is formed on the upper end surface of the crystal oscillating reeds is etched. In this manner, the electrode film is completely removed. However, photoresist adheres to the two side surfaces and lower surface of the crystal oscillating reeds and so this portion, which is not exposed to light, remains even after the development. As a result, this electrode film remains after the electrode film is subjected to etching. This residual electrode film becomes side electrode 507. The thus-formed crystal oscillating reeds remain attached by tie bars 506. Crystal oscillating reeds may be removed from tie bars 506, and at that point the portion of side electrodes 506 which are disposed on the bottom of the crystal oscillating reeds are electrically disconnected.

Figure 42:
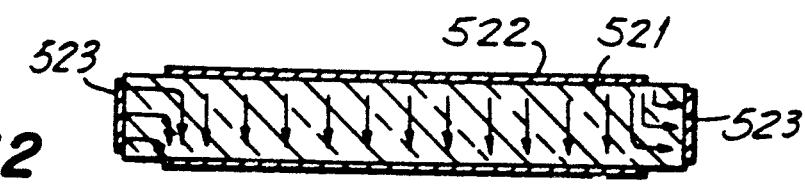
FIG. 42 is a cross-sectional view of a crystal oscillating reed similar to the one depicted in FIG. 38.

A cross-sectional view of the exciting electrode portion of an AT-cut crystal oscillating reed, similar to that depicted in FIGS. 37-39, is shown in FIG. 42. Exciting electrodes 522 generate oscillating energy in crystal oscillating reed 521. The arrows designate the direction of electric field acting on crystal 521. However, additional electric fields are generated as a result of side electrodes 523. This combination of electric fields serves to decrease the CI value of the crystal oscillating reed of FIG. 42. However, the electric fields generated by side electrodes 523 do not increase the amount of spurious oscillations since the fields act not only in the thickness direction but also in the width direction.

Figure 43:
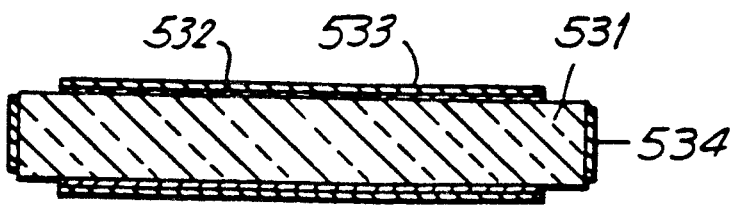
FIG. 43 is a cross-sectional view of a crystal oscillating reed in accordance with a sixteenth embodiment of the invention.

A variation of the crystal oscillating reed of FIG. 42 is depicted in cross-sectional view in FIG. 43 according to a sixteenth embodiment of the invention. Crystal 531 has side electrodes 534 similar to FIG. 42. However, the exciting electrodes are made of a combination of first metal film 532 and second metal film 533.

The steps of forming crystal oscillating reed 531 are different from the steps shown in FIGS. 40A–40F and 41A–41F which are used to manufacture the device in FIG. 42. In manufacturing the device shown in FIG. 42, the metal electrode film is applied after the photoresist and metal film have been separated. However, the crystal oscillating reed shown in FIG. 43 is manufactured so that only the photoresist is separated before the metal film is formed on the portion from which the photoresist has been separated. This leaves two metal layers for a double layer exciting electrode structure consisting of the first metal layer 532 and second metal layer 533. The double layer significantly contributes to confining the oscillation energy in the exciting electrode portion.

When the AT-cut crystal oscillating reeds depicted in FIGS. 8–43 are manufactured by the etching process shown in FIGS. 6A–6D, a synergistic benefit is obtained. The AT-cut crystal oscillating reed can be manufactured by this process with the end surface of either the longer or shorter side to be the flat surface which is substantially perpendicular to the main surface of the corrosion resisting film. Thus, the longer or shorter side is made to be flat with no steps. If the crystal oscillating reed embodiments shown in FIGS. 8–43 are manufactured by the conventional machine process, a complicated manufacturing process is necessary, particularly in view of the varying shapes in the crystal oscillating reeds. However, if these embodiments are manufactured by the etching process, it is simply necessary to prepare a photo mask for projecting the shape of the corrosion resisting film to be the desired shape of the crystal oscillating reed. Thus, using the etching process shown in FIGS. 6A–6D, flat side surfaces may be obtained with a less complicated procedure than the conventional machining process.

Figure 44A:
FIG. 44A is a top plan view of a rough crystal before cutting.
Figure 44B:
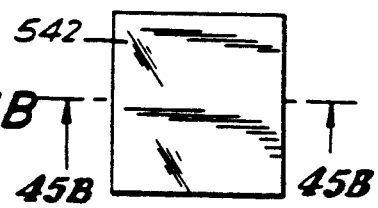
FIGS. 44B–44F are front elevational views illustrating steps for forming a series of crystal oscillating reeds in accordance with a seventeenth embodiment of the invention.
Figure 44C:
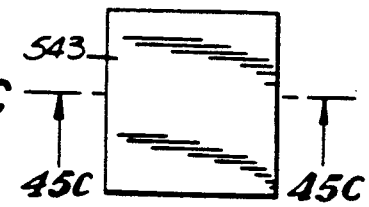
Figure 44D:
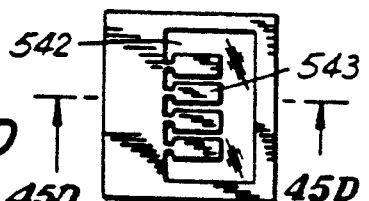
Figure 44E:
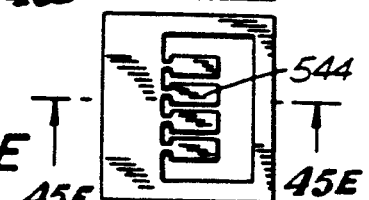
Figure 44F:
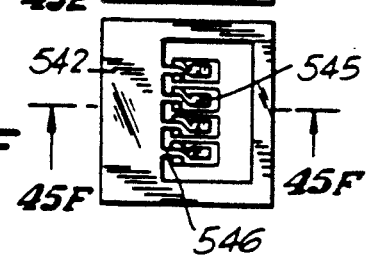
Figure 45B:
FIGS. 45B–45F are cross-sectional views taken along lines 45B—45B through 45F—45F of FIGS. 44B–44F, respectively.

Steps for manufacturing an AT-cut crystal oscillating reed in accordance with a seventeenth embodiment of the invention are shown in FIGS. 44A–44F and 45B–45F. FIG. 44A illustrates a process of cutting a rough crystal 541 at a predetermined angle to obtain a plurality of crystal wafers 542 using the "boundary" technique. Crystal wafer 542, as shown in FIGS. 44B and 45B, is ground to have a predetermined thickness.

Figure 45C:
Figure 45D:
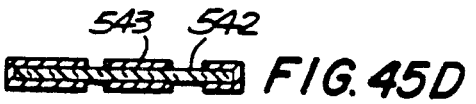

As shown in FIGS. 44C and 45C, a metal film 543 is formed on crystal wafer 542 by evaporating or sputtering a chrome base followed by gold or silver. Metal film 543 is shaped as shown in FIGS. 44D and 45D using a photoresist which is first applied to the surface of the crystal wafer 542 on which metal film 543 has been formed. A photomask which is shaped into the desired multiple reed pattern is employed to shield the pattern while the wafer is exposed to light. The photoresist is developed, and the residual photoresist which is in the desired pattern is used as a part of the corrosion resisting film.

Figure 45E:
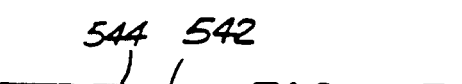
Figure 45F:
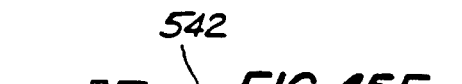

Next, the actual wafer 542 is shaped into the desired pattern by etching, using metal film 543 as corrosion resisting film. A mixed solution of hydrofluoric acid and ammonium fluoride is used as etching liquid. Multiple crystal oscillating reeds 544 are patterned, as is illustrated in FIGS. 44E and 45E. Finally, the electrode film is shaped into exciting electrodes 545 as well as external connection electrodes as shown in FIGS. 44F and 45F, using a photoresist technique similar to the steps shown in FIGS. 44D and 45D for shaping the metal film.

Multiple crystal oscillating reeds 544 may be formed simultaneously with a single crystal wafer 542. Crystal oscillating reeds 542 are connected to the tie bar junction 546. When a crystal oscillating reed 544 is connected to an external terminal, the portion connected to tie bar 546 is broken so that crystal oscillating reed 545 can function independently.

In the manufacturing step shown in FIGS. 40A–40F and 41A–41F, the metal film which served as the corrosion resisting film was separated and another metal film was formed as the electrode film. However, in the steps shown in FIGS. 44A–44F and 45B–45F, the metal film used as the corrosion resistance film is not separated but is used as the electrode film. Thus, the manufacturing process is simplified.

The metal film thus formed may be used by itself as exciting electrode 545. Or, an additional metal film may be formed by sputtering so that exciting electrode 545 is a double-metal layer structure.

In summary, the invention provides an AT-cut crystal oscillating reed which has a flat, smooth side surface and low CI value. Moreover, AT-cut crystal oscillating reeds may be mass produced at a relatively low cost by utilizing the corrosion resisting film as the external connection and exciting electrodes in accordance with the invention.

It will thus be seen that the objects set forth above, among those made apparent from the preceding description, are efficiently attained and, since certain changes may be made in carrying out the above method and in the composition set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of etching a crystal oscillating segment for use as a crystal oscillating reed, comprising:
   cutting a crystal wafer having a front and back surface from a rough crystal;
   forming etching resisting films on the front and back surfaces of the crystal wafer, said etching resisting films having gaps at the portion of the wafer to be etched for forming the crystal segment; and
   etching the wafer to form at least one side edge of a crystal oscillating segment, said at least one side edge being at an angle of about 90° from the front or back surface of the crystal oscillating reed.

2. The method of claim 1, wherein said crystal wafer includes a rotational parallel cut obtained by rotating a parallel cut by an angular degree of $\theta°$ relative to the X-axis of the wafer.

3. The method of claim 1, wherein the crystal oscillating reed is an AT-cut oscillating reed.

4. The method of claim 2, wherein $\theta$ is between about 35° and 40°.

5. The method of claim 4, wherein the thickness of the wafer is designated t, the width of the gaps in the etching resisting films is designated l, and $l \geq t/\tan \theta$.

6. The method of claim 5, wherein the width of the gap in the etching resisting film on the front surface of the crystal wafer is the same as the width of the gap in the etching resisting film on the back surface of the crystal wafer.

7. The method of claim 5, wherein the width of the gap in the etching resisting film on the front surface of the crystal wafer is different from the width of the gap in the etching resisting film on the back surface of the crystal wafer.

8. The method of claim 1, wherein the edges of the etching resisting film on the surface of the crystal wafer which forms the gap therein is out of registration with the edges of the etching resisting film on the back surface of the crystal wafer which forms the gap therein, and wherein said at least one side edge at an angle of about 90° extends from one of the edges of the gap in one of the etching resisting films.

9. The method of claim 6, wherein the etching is wet etching utilizing hydrofluoric acid.

10. The method of claim 1, wherein the etching is dry etching.

* * * * *